United States Patent
Chen et al.

(10) Patent No.: US 6,172,404 B1
(45) Date of Patent: Jan. 9, 2001

(54) TUNEABLE HOLDING VOLTAGE SCR ESD PROTECTION

(75) Inventors: Julian Z. Chen, Plano; Thomas A. Vrotsos, Richardson, both of TX (US); Yun-Shan Chang, Sunnyvale, CA (US)

(73) Assignee: Texas Instruments Incorporated, Dallas, TX (US)

( * ) Notice: Under 35 U.S.C. 154(b), the term of this patent shall be extended for 0 days.

(21) Appl. No.: 09/183,351

(22) Filed: Oct. 30, 1998

Related U.S. Application Data

(60) Provisional application No. 60/063,777, filed on Oct. 31, 1997.

(51) Int. Cl.[7] .............................. H01L 29/78; H01L 23/62
(52) U.S. Cl. .......................... 257/361; 257/363; 257/358; 257/360; 257/173; 257/162
(58) Field of Search ..................................... 257/141, 162, 257/173, 174, 360, 361, 379, 358, 363

(56) References Cited

U.S. PATENT DOCUMENTS

| 4,896,243 | * | 1/1990 | Chatterjee | 257/379 |
| 4,939,616 | | 7/1990 | Rountree | 361/56 |
| 5,012,317 | | 4/1991 | Rountre | 357/38 |

* cited by examiner

*Primary Examiner*—Jerome Jackson, Jr.
(74) *Attorney, Agent, or Firm*—Dwight N. Holmbo; Wade James Brady III; Frederick J. Telecky Jr.

(57) ABSTRACT

An SCR provides for increased holding voltage by decoupling the pnp and npn parasitic bipolar transistors of the SCR. In one embodiment, a N+ region is placed between the n+ region and the p+ region normally associated with conventional SCR devices, to formulate a new resistance. The new resistance is manifested to allow more current to flow through the new resistance rather than through the SCR parasitic pnp bipolar transistor. Since the parasitic pnp bipolar transistor no longer turns on as strongly as it would otherwise without the low resistance path through the new resistor, the holding voltage of the SCR is raised.

10 Claims, 4 Drawing Sheets

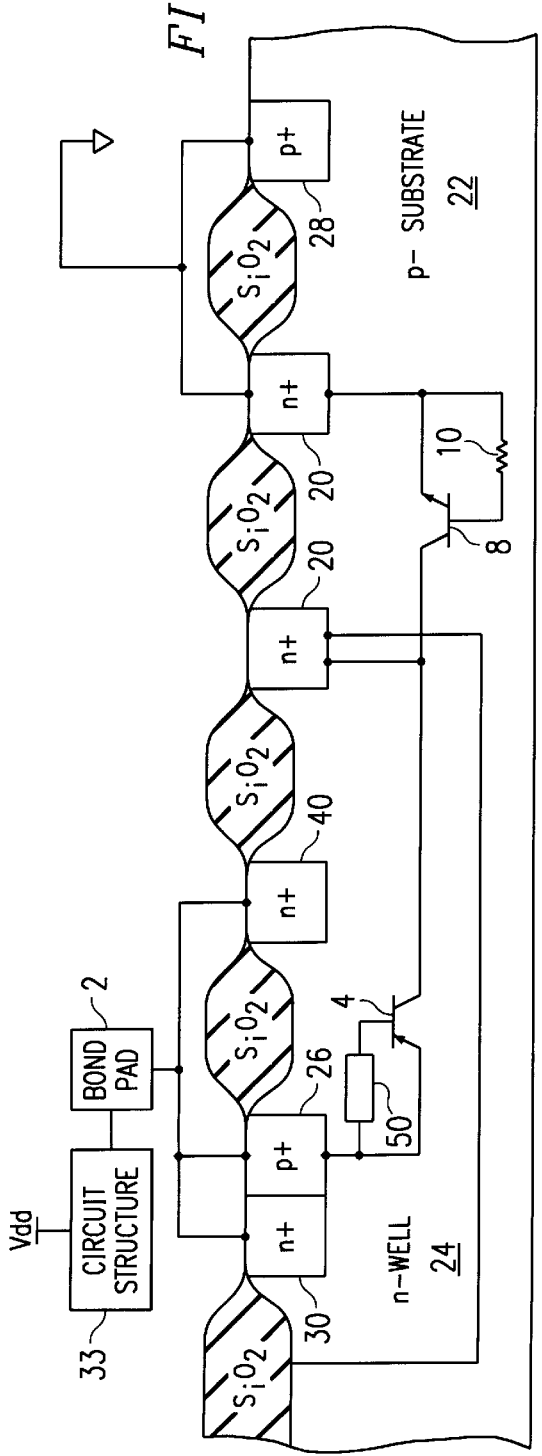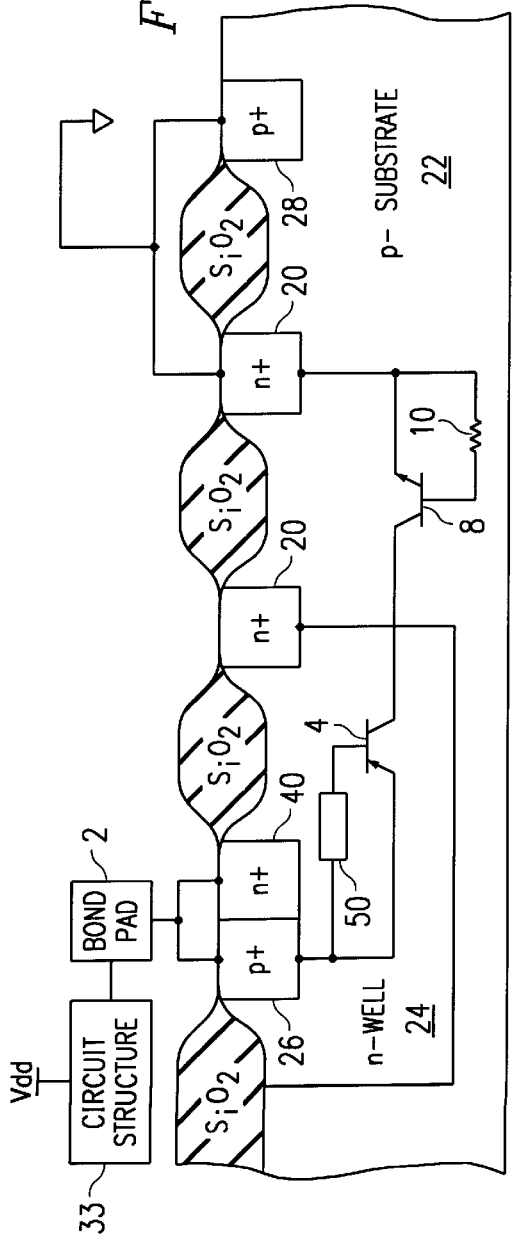

US 6,172,404 B1

TUNEABLE HOLDING VOLTAGE SCR ESD PROTECTION

This application claims priority under 35 USC §119(e)(1) of provisional application number 60/063,777 filed Oct. 31, 1997.

BACKGROUND OF THE INVENTION

Protection against electrostatic discharge (ESD) is of primary concern in integrated circuit development. At present, the two most prevalent approaches for providing ESD protection is by use of n-channel metal-oxide-semiconductor (NMOS) transistor protection and by use of semiconductor-controlled rectifier (SCR) protection.

NMOS protection schemes, wherein a parasitic lateral npn transistor is used as the primary protection device, have been used to protect circuit structure fabricated according to a CMOS process. The NMOS is fabricated according to this process as well, or according to a compatible process, on an integrated circuit. For circuit structure fabricated according to a CMOS process, having a feature size larger than 1 μm, for which ESD protection is sought, the lateral npn has been shown to offer poor ESD performance. Hence, SCR use is the primary approach used to provide ESD protection for CMOS fabricated circuits having a feature size of larger than 1 μm.

On-chip electrostatic discharge devices such as SCRs, exhibit holding voltages (also known as snapback voltages) which in conjunction with an associated increase in current, provide a highly desirable characteristic for discharging high-voltage, transient, electrostatic charges from the bond pads of a semiconductor integrated circuit.

FIG. 1 illustrates a schematic drawing showing the parasitic bipolar devices of a conventional SCR ESD protection circuit. In connection with a high voltage electrostatic charge on bond pad 2, parasitic bipolar pnp transistor 4 turns on after the base-emitter voltage across resistor 6 drops beneath a threshold voltage associated with parasitic bipolar transistor 4. Parasitic bipolar npn transistor 8 turns on and conducts current to circuit ground in connection with the base-emitter voltage across resistor 10 being above an associated threshold voltage. The conduction of parasitic npn transistor 8 causes an additional voltage drop at the base of parasitic pnp transistor 4 which in turn causes parasitic transistor 4 to conduct more rigorously. As the emitter-collector voltage of parasitic transistor 4 begins to decrease via an increasing collector voltage, as a result of the more rigorous conduction, parasitic transistor 8 conducts more rigorously. The simultaneous conduction of transistors 4 and 8 is known as the latch-up condition. Thus, the reinforcing feedback caused by parasitic transistors 4 and 8 during latch-up causes the electrostatic charge at bond pad 2 to be discharged.

With reference to FIG. 2 (and following the arrows) which is a current ($I_m$) vs. voltage ($V_{AB}$) sketch showing the relationship of the current flowing from point A to point B through a resistance $R_m$ (i.e., resistor $R_m$ can represent a resistance through a current and voltage meter), shown in FIG. 1 to the voltage $V_{AB}$ across points A and B ($V_{AB}=V_m-I*R_m$, $V_m$ being the meter supply voltage), very little current flows prior to latch-up. At latch-up, the trigger point of the circuit of FIG. 1 is reached whereby the voltage across points A and B of FIG. 1 drops down to the holding voltage or as it is sometimes called, the snap-back voltage of the circuit. After the holding voltage (snap-back voltage) point, much current is discharged through transistors 4 and 8 as represented by the Im sketch past the snap-back point. Note that the sketch in FIG. 2 is not complete in that it does not show the I-V characteristic during complete discharge of bond pad 2 in FIG. 1. Also that $V_m$, $R_m$ and $I_m$ are only shown for the sake of explaining the I-V sketch shown in FIG. 2.

FIGS. 3a and 3b represent cross-sectional/schematic drawings of a conventional SCR and a modified lateral SCR (MLSCR) respectively. The primary difference in structure between the conventional SCR and the modified lateral SCR lies in the existence of n+ region 36 at the edge of n-well 24 of FIG. 3b. N+ region 36 allows a lower junction breakdown voltage for the n+/p- junction formed by n+ region 36 and p+ substrate 22, This lower breakdown voltage generally results in a lower trigger voltage for the MLSCR shown in FIG. 3b as compared with the SCR of FIG. 3a. Parasitic npn transistor 8 is formed by n+ region 20, p-doped substrate 22, and n-type well region (n-well) 24. Parasitic pnp transistor 4 is formed by p- substrate 22, n-well region 24 and p+ region 26. N+ region 30 provides contact to n-well 24. Silicon dioxide ($SiO_2$) provides isolation between the n+ and p+ regions shown. Circuit structure 33, for which ESD protection is sought, is shown connected to bond pad 2. The SCRs shown in FIGS. 3a and 3b usually have a low holding voltage of around 1 to 2 volts. Should this voltage be lower than the power supply voltage Vdd to circuit structure 33, then it will not be possible to discharge a voltage at bond pad 2 to ground since voltage Vdd supplies energy to the SCR to keep the SCR in latch-up. CMOS fabricated processes for the formation of the SCR and circuit structure 33 will likely involve power supply voltages which are higher than the holding voltage associated with the SCR. Consequently, problems may result in the inability to shut off the latch-up condition after an ESD event or after a power surge or spike in circuit structure 33 which, through bond pad 2, sends the SCR into latch-up. This potential latch-up shut-off problem limits the applicability of SCR ESD protection applications. For example, SCR protection is usually not recommended for power supply protection.

BRIEF DESCRIPTION OF THE DRAWINGS

FIG. 4a illustrates a partial cross-sectional/schematic drawing of a first preferred embodiment of the invention.

FIG. 4b illustrates a partial cross-sectional/schematic drawing of an alternative embodiment of the invention.

DETAILED DESCRIPTION OF THE INVENTION

The invention provides a novel SCR which provides a holding voltage which is higher than the associated power supply voltage. For example, conventional SCRs typically have a holding voltage of between 1 and 2 volts, wherein the supply voltage may range from 2.7 volts, 3 volts or 5 volts. The invention's SCR can be tuned to provide a holding voltage which is selected to be greater than the supply voltage. Consequently, the invention's SCR can provide ESD protection for all pins of a semiconductor chip including the pins to the power supply. The invention raises the holding voltage by decoupling the pnp and npn parasitic bipolar transistors of the SCR. The invention's new SCR is especially compatible with fabrication according to well known CMOS fabrication processes and as such the invention is especially suitable for providing ESD protection for these types of circuits.

Figure 1:
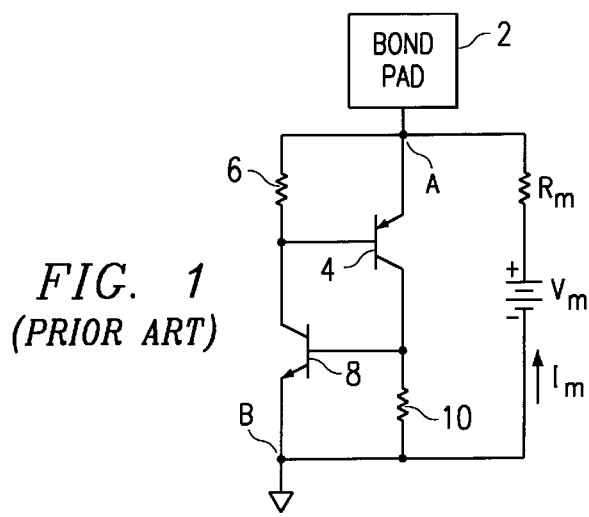
FIG. 1 illustrates a schematic drawing showing the parasitic bipolar devices of a conventional SCR ESD protection circuit.
Figure 2:
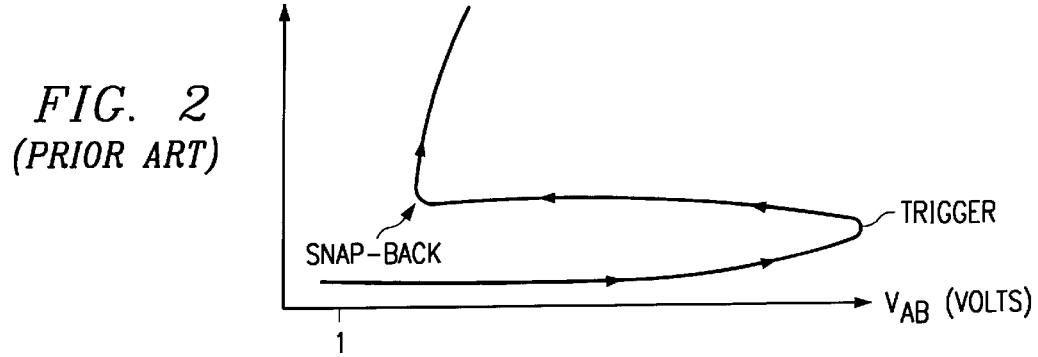
FIG. 2 is a sketch of the current ($I_m$) vs. voltage ($V_{AB}$) of the SCR shown in FIG. 1.
Figure 3A:
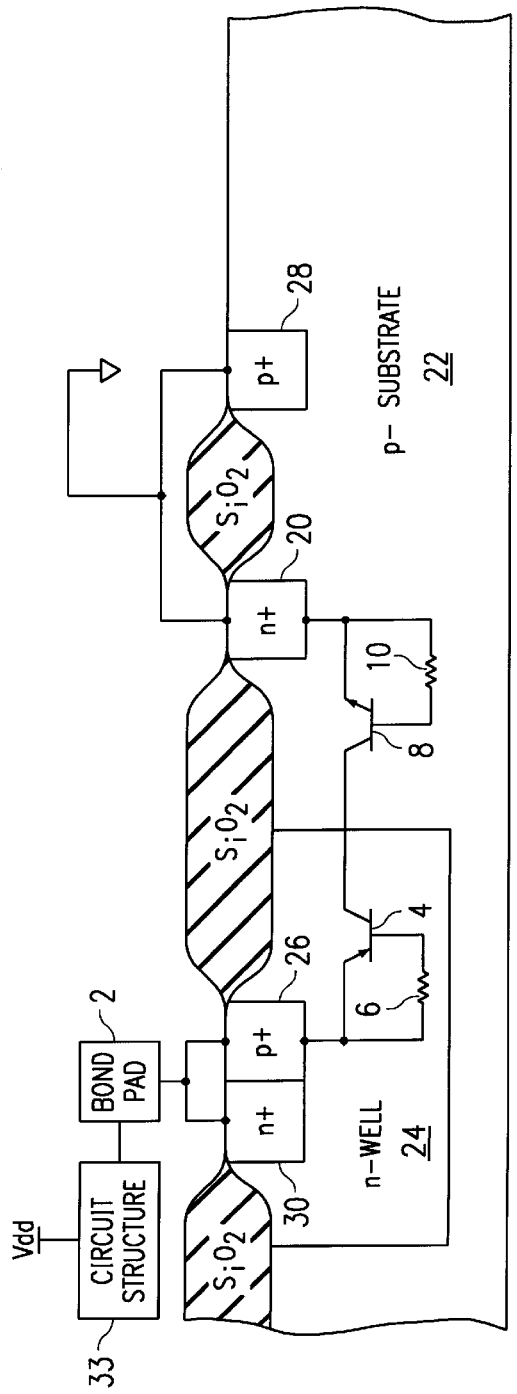
FIGS. 3a and 3b represent cross-sectional/schematic drawings of a conventional SCR and a modified lateral SCR (MLSCR) respectively.
Figure 3B:
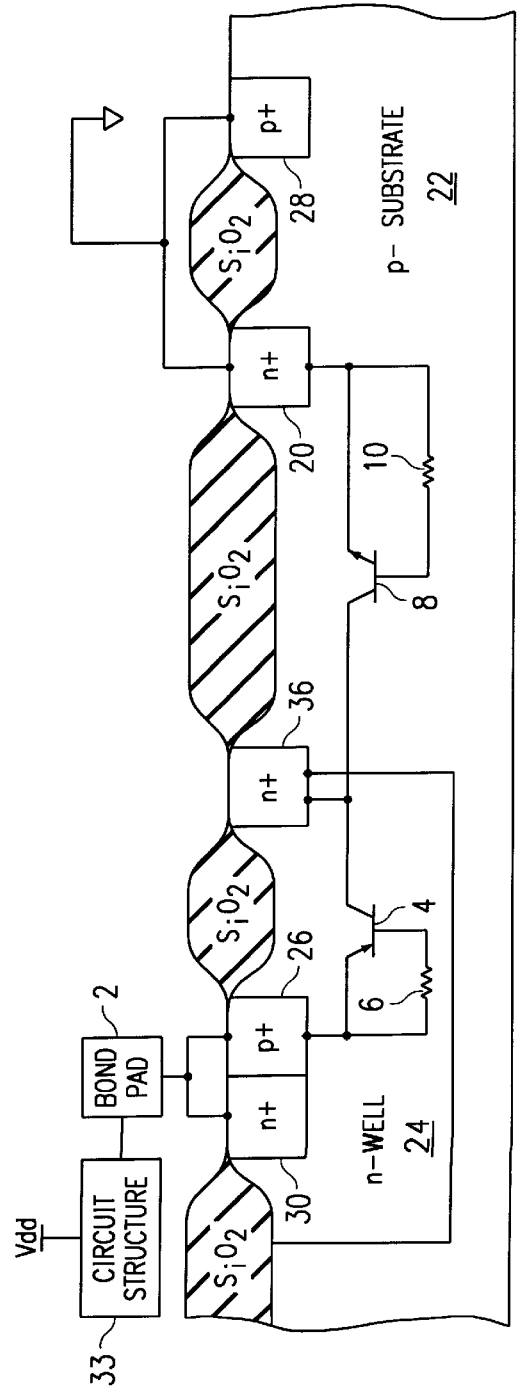

FIG. 4a illustrates a partial cross-sectional/schematic drawing of a first preferred embodiment of the invention. N+ region 40 is placed between n+ region 20 and p+ region 26. It serves to reduce the resistance, formerly indicated by reference numeral 6 in FIGS. 2, 3a and 3b. This new resistance is indicated by reference numeral 50. Based on the principal that more current flows through the path of least resistance as compared with that which flows through a path with more resistance, the resistance reduction manifests itself by allowing more current to flow through resistance 50 rather than through parasitic pnp bipolar transistor 4. Transistor 4 therefore does not turn on as strongly as it would otherwise without the low resistance path through resistance 50. Consequently, the SCR does not pull bond pad 2 down in voltage to circuit ground, rather, the holding voltage of the SCR is raised. The specific placement of n+ region 40 between p+ region 26 and n+ region 20 determines the holding voltage of the SCR. Therefore, the SCR holding voltage can be tuned to the voltage desired depending upon where n+ region 40 is placed.

FIG. 4b illustrates a partial cross-sectional/schematic drawing of an alternative embodiment of the invention. Region 30 as shown in FIG. 4a has been eliminated and region 40 now abuts region 26. It should be noted that this is an option with other n+ and p+ region as well. For instance, instead of n+ region 20 being separated from p+ region 28 by silicon dioxide, these regions could be formed so as to abut one another. As shown in FIG. 4b, this embodiment of the invention also serves to reduce the resistance through the current path through n+ region 40 so as to reduce the holding voltage of the SCR.

Figure 5A:
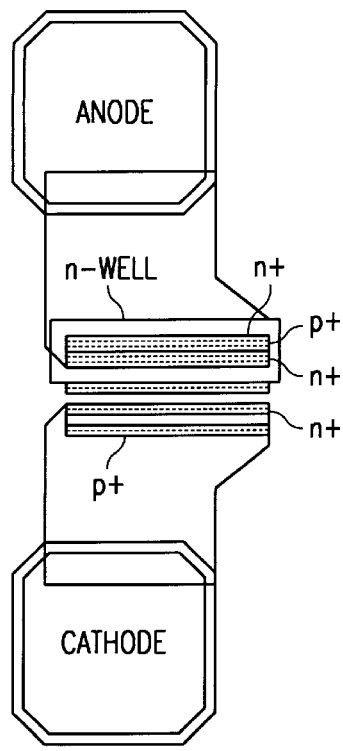
FIGS. 5a, 5b and 5c are top view drawings which illustrate the layout of the invention's new SCR.
Figure 5B:
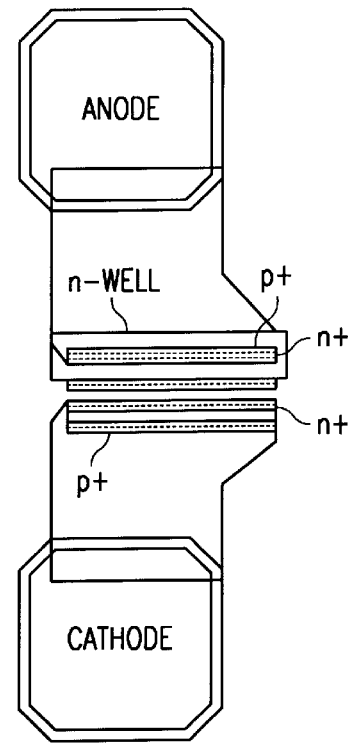
Figure 5C:
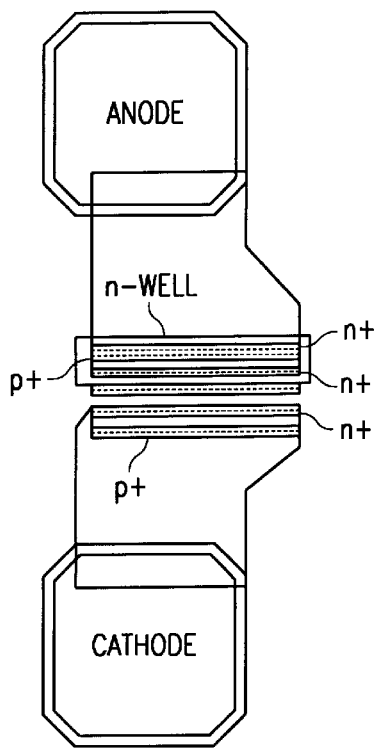
Figure 5D:
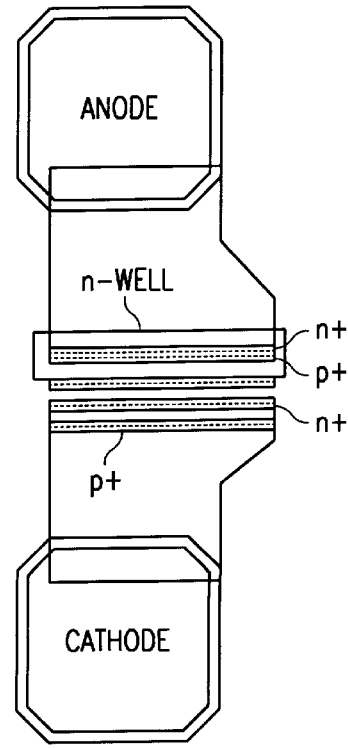
FIG. 5d is a top view drawing of the layout of a conventional SCR.

FIGS. 5a, 5b and 5c are top view drawings which illustrate the layout of the invention's new SCR. N+ and p+ regions are identified in these drawings. Anode and cathode regions are identified which by convention, the anode represents the emitter of the pnp transistor while the cathode represents the emitter of the npn transistor. For comparison. a top view drawing of the layout of a conventional SCR is shown in FIG. 5d.

Figure 6:
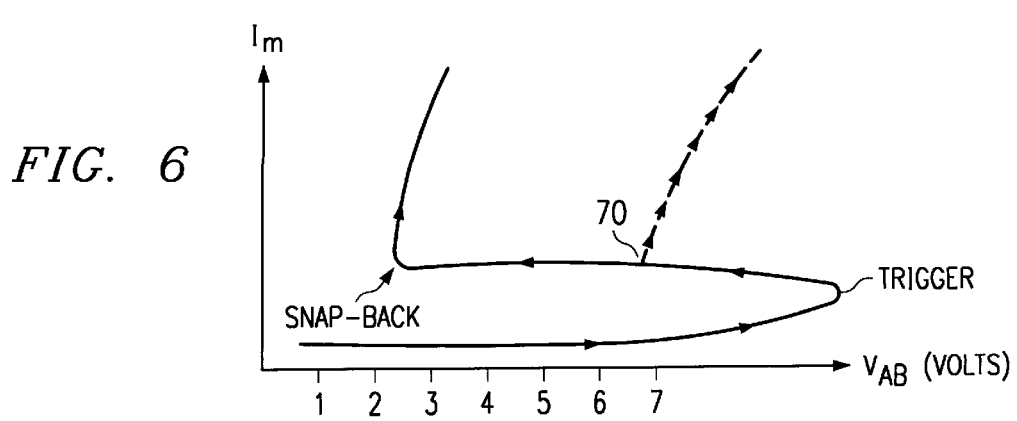
FIG. 6 is drawing which show the generalized sketch of the current (I) vs. voltage (V) of the invention's SCR.

FIG. 6 is drawing which show the generalized sketch of the current (I) vs. voltage (V) of the invention's SCR. The new SCRs snap-back or holding voltage is indicated at reference numeral 70. The sketch of the invention's SCR is contrasted with that of the previous SCR in that the new SCR plot deviates from the arrowhead path of the solid line to the dotted line shown in accordance with the new holding voltage.

Although the invention has been described in detail herein with reference to its preferred embodiment, it is to be understood that this description is by way of example only, and it is not to be construed in a limiting sense. It is to be further understood that numerous changes in the details of the embodiments of the invention, and additional embodiments of the invention, will be apparent to, and may be made by persons of ordinary skill in the art having reference to this description. For instance n-type regions can be substituted with p-type regions consistently throughout Further the aforementioned regions can be formed by a process of diffusion or by implant. It is contemplated that all such changes and additional embodiments are within the true scope and spirit of the invention as claimed below.

What is claimed is:

1. A semiconductor-controlled rectifier comprising:
   (a) a lightly doped substrate of a first conductivity type;
   (b) a region of a second conductivity type,
      wherein the boundaries of said region of said second conductivity type define the edges of a well within said substrate;
   (c) a highly doped region of said second conductivity type within said substrate outside of said well;
   (d) a highly doped region of said first conductivity type, within said well;
   (e) a highly doped region of said second conductivity type disposed at the edge of said well; and
   (f) a highly doped region of said second conductivity type within said well and interposed between element (d) and (e).

2. A semiconductor-controlled rectifier as recited in claim 1 wherein said first conductivity type is n-type and wherein said second conductivity type is p-type.

3. A semiconductor-controlled rectifier as recited in claim 1 wherein said first conductivity type is p-type and wherein said first conductivity type is n-type.

4. A semiconductor-controlled rectifier as recited in claim 1 which further includes (g) a highly doped region of said second conductivity type, adjacent a side of element (d), which is on an opposite side from element (f).

5. A semiconductor-controlled rectifier as recited in claim 4 which further includes a bond pad connected to element (d), element (f) and element (g).

6. A semiconductor-controlled rectifier as recited in claim 5 wherein the distance of element (f) from element (d) is selected so that the trigger voltage of said semiconductor-controlled rectifier is higher than a circuit supply voltage associated with said bond pad.

7. A semiconductor-controlled rectifier comprising:
   (a) a lightly doped substrate of a first conductivity type;
   (b) a region of a second conductivity type,
      wherein the boundaries of said region of said second conductivity type define the edges of a well within said substrate;
   (c) a highly doped region of said second conductivity type within said substrate outside of said well;
   (d) a highly doped region of said first conductivity type, within said well:
   (e) a highly doped region of said second conductivity type disposed at the edge of said well; and
   (f) a highly doped region of said second conductivity type within said well and interposed between element (d) and (e) and abutting element (d).

8. A semiconductor-controlled rectifier as recited in claim 7 wherein said first conductivity type is n-type and wherein said second conductivity type is p-type.

9. A semiconductor-controlled rectifier as recited in claim 7 wherein said first conductivity type is p-type and wherein said first conductivity type is n-type.

10. A semiconductor-controlled rectifier as recited in claim 7 which further includes a bond pad connected to element (d), and element (f).

* * * * *